United States Patent [19]
Lebby et al.

[11] Patent Number: 5,699,073
[45] Date of Patent: Dec. 16, 1997

[54] INTEGRATED ELECTRO-OPTICAL PACKAGE WITH CARRIER RING AND METHOD OF FABRICATION

[75] Inventors: Michael S. Lebby, Apache Junction; Fred V. Richard, Scottsdale; John W. Stafford, Phoenix, all of Ariz.

[73] Assignee: Motorola, Schaumburg, Ill.

[21] Appl. No.: 610,501

[22] Filed: Mar. 4, 1996

[51] Int. Cl.$^6$ ................................. G09G 3/32
[52] U.S. Cl. .................. 345/82; 345/205; 313/500; 257/99; 437/209
[58] Field of Search ................ 345/82, 83, 39, 345/46, 205, 206, 903, 905; 348/801, 802; 313/500, 502, 504, 505, 510; 257/79, 81, 88, 99; 349/11, 56, 149–152; 437/209, 211, 210

[56] References Cited

U.S. PATENT DOCUMENTS

| | | | |
|---|---|---|---|
| 4,431,270 | 2/1984 | Funada et al. | 349/149 |
| 4,933,601 | 6/1990 | Sagawa et al. | 313/500 |
| 5,130,833 | 7/1992 | Mase | 349/149 |
| 5,168,384 | 12/1992 | Genba | 349/150 |
| 5,457,356 | 10/1995 | Parodos | 313/505 |
| 5,530,269 | 6/1996 | Tang | 313/504 |
| 5,576,869 | 11/1996 | Yoshida | 349/149 |

Primary Examiner—Steven Saras
Attorney, Agent, or Firm—Eugene A. Parsons

[57] ABSTRACT

An integrated electro-optical package (40) including an optically transparent substrate (10) with an array (15) of light emitting devices (LEDs) (12) formed thereon, cooperating to generate a complete image, thereby forming a LED display chip (14). The LEDs (12) are positioned in rows and columns and having electrical connections adjacent outer edges of the substrate (10). A driver board (30), having embedded electrical conductors (34), plated through-hole vias (44) and/or embedded leadframes (45) for cooperating with the LEDs (12) of the LED display chip (14) and further having a plurality of driver and control circuits (42) connected to the driver board (30) and LEDs (12). A molded carrier ring (50), electrically interfaced with the driver board (30), the LED display chip (14) and the driver and control circuits (42). A molded refractive or diffractive lens (60) positioned in alignment with the array (15) of LEDs (12) of the LED display chip (14) and on a side opposite the mounting of the LED display chip (14), thereby capable of magnifying the image and producing an easily viewable virtual image.

41 Claims, 7 Drawing Sheets

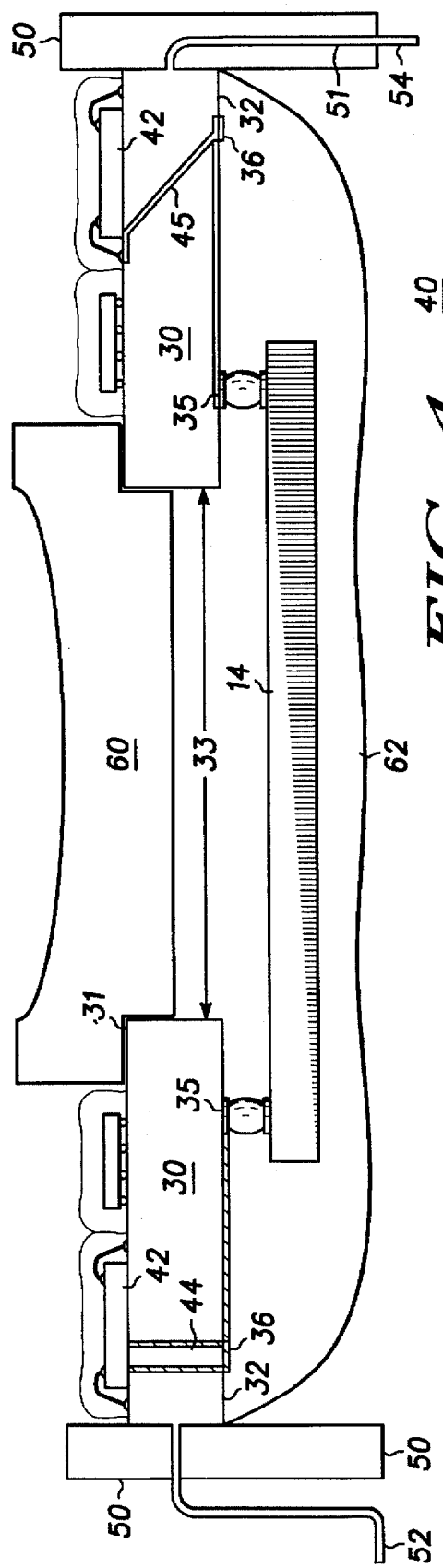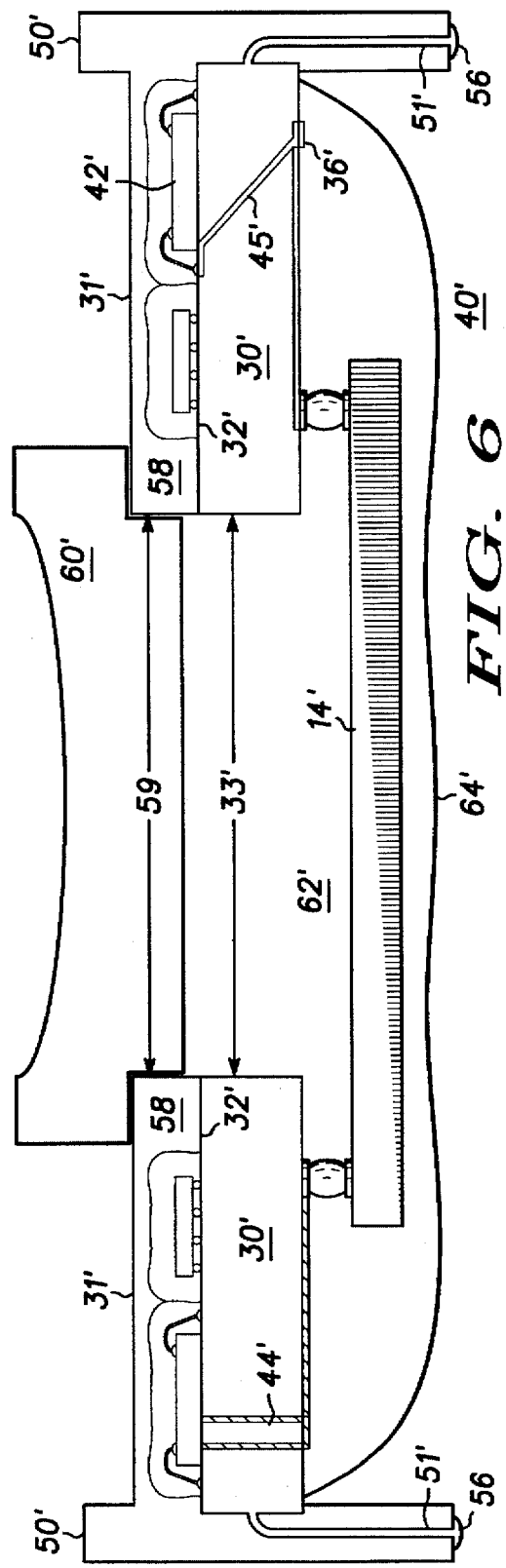

INTEGRATED ELECTRO-OPTICAL PACKAGE WITH CARRIER RING AND METHOD OF FABRICATION

FIELD OF THE INVENTION

The present invention pertains to packages containing electrical and optical components connected in cooperation and more specifically to an integrated electro-optical package having a carrier ring for electrically connecting optical components and driver circuits in electrical circuitry.

BACKGROUND OF THE INVENTION

Portable communications transceivers and other portable electronic equipment, such as cellular and cordless telephones, pagers, data banks, and the like, are becoming increasingly popular. In some instances it is possible to send complete messages, including alpha-numerics and/or graphics by way of novel pagers. Thus, complete messages can be sent to specific recipients. Through the use of digital signals that are being transmitted at ever increasing frequencies, it is possible to transmit increasingly larger and more complex messages to remote portable units, using novel devices.

Of greatest importance when utilizing these new novel devices to transmit and receive information, is the display through which the information is received. It is desirable to incorporate into these novel devices an electro-optical package containing electrical and optical components that are capable of producing a display that is large enough to be useful, while in keeping with size restrictions as well as low electrical power needs.

Light emitting devices (LEDs) are useful in various displays and are utilized in display modules that are incorporated into electro-optical packages to create an image which is then magnified to the extent necessary for the user to view the image. LEDs are especially useful in a new miniature virtual image display that utilizes a two-dimensional array of LEDs as an image source. Generally, these two dimensional arrays include large numbers of light emitting devices, from 5000 to 80,000 or more. A specific example exists where the image source consists of a high pixel count 2-dimensional array of LEDs, such as 240 columns by 144 rows, for a total of 34,560 pixels. An array the size of this specific example requires a total of 384 external interconnections to properly scan, or activate, and produce an image thereon. The array of LEDs is used to form complete images containing pictorial (graphic) and/or alphanumeric characters. The complete images are then magnified to produce virtual images which appear to an operator to be at least the size of a standard sheet of paper.

A major problem facing the productizing of such arrays is the penalty paid for this very large number of connection, or bond, pads required to provide information to the array and in the interfacing of the array with additional components of the electro-optical package. One specific drawback in the development of this type of electro-optical packages is the increased semiconductor chip or chip area required for the connection pads and the interconnect fanout necessary to connect the connection pads to the rows and columns. A significant portion of the projected cost of the semiconductor chip on which the array is constructed is in the starting material and, with the 240×144 example set up for wire bonded external interconnects, the emitting region (light emitting device array) occupies less than 20% of the total chip area with the remaining 80% required for connection pads and interconnect fan out. Conventional direct chip attach (DCA) bonding will improve this ratio only slightly because of the large pad sizes and interconnect pitches associated with the current state-of-the-art.

A large bonding substrate area is also required since a similar pad and interconnect fanout pattern must be repeated on accompanying semiconductor chips containing the drive electronics. Furthermore, the drive chips themselves must be large enough to accommodate the large number of connection pads (384 in this example).

An additional drawback in the development of electro-optical packages is the incorporation of an optical magnification system. Typically an external lens system is applied to magnify the image generated by the array of LEDs for ease of viewing by the user. The net result is a large overall package which is not attractive for the applications of portable electronic devices where a premium is placed on small physical volumes.

One way to alleviate package size problems in LED display packaging is to simplify the package and assembly by integrating the driver board with a molded carrier ring, together capable of supporting a LED display chip, a plurality of drive chips and a molded lens that serves as one element of an optical magnifier system. The molded carrier ring, has embedded therein leadframes, and in combination with its supporting abilities, aids in minimizing the size requirement of the electro-optical package and the ability to interface with a printed circuit board. Included within the electro-optical package is the incorporation of a plurality of driver and controller circuits mounted on the driver board, having data input terminals and further having control signal output terminals interfaced with a plurality of leads of the light emitting devices for activating the light emitting devices to generate images in accordance with data signals applied to the data input terminals.

In inorganic LED configurations, generally a semiconductor substrate, or integrated circuit, is mounted on a printed circuit board or the like and the accepted method for connecting the substrate to external circuits is to use standard wire bond technology. However, when a semiconductor substrate having a relatively large array of electrical components or devices formed thereon is to be connected, standard wire bond techniques can become very difficult. For example, if a relatively large array (greater than, for example, 10,000 or 100×100) of light emitting diodes is formed on a substrate with a pitch (center-to-center separation) of P, then connection pads on the perimeter of the substrate will have a 2P pitch. This is true because every other row and every other column goes to an opposite edge of the perimeter to increase the distance between the connection pads as much as possible.

At the present time wire bond interconnects from connection pads having a pitch of 4.8 mils is the best that is feasible. Thus, in the array mentioned above of 100×100 light emitting devices the connection pads on the perimeter of the semiconductor chip would have a minimum pitch of 4.8 mils, with 50 connection pads situated along each edge of the perimeter. As more devices are included in the array, more connection pads are required and the perimeter size to accommodate the additional connection pads increases at an even greater rate. That is, since the minimum pitch of the bonding pads is 4.8 mils, the pitch of the devices in the array can be as large as 2.4 mils, or approximately 61 microns, without effecting the size of the substrate. Thus, even if the devices can be fabricated smaller than 61 microns, the minimum pitch of the bonding pads will not allow the perimeter of the substrate to be made any smaller. It can quickly be seen that the size of the substrate is severely limited by the limitations of the wire bonding technology.

Of greatest concern is time and cost spent in the manufacturing of electro-optical packages containing electrical components which are typically interfaced using wire bonding technology, and optical components which are required for magnification. In addition, there exist drawbacks in the ease of interfacing the electro-optical package to a printed circuit board, or the like, or in the overall ease of handling the completely integrated package.

Thus, there is a need for interconnect and packaging structures and techniques which can substantially reduce the manufacturing cost and assembly time for an electro-optical package containing electrical and optical components connected in electrical cooperation.

Accordingly, it is highly desirable to provide methods of fabricating LED arrays and interconnect apparatus packages which overcome these problems.

It is a purpose of the present invention to provide a new and improved method of fabricating LED arrays and interconnect apparatus packages.

It is a further purpose of the present invention to provide a new and improved LED array and integrated driver circuitry packaging for driving large arrays of LEDs which includes the use of a molded carrier ring to support a display chip, a plurality of driver chips, a driver board, and a molded lens that serves as one element of an optical magnifier system.

It is a still further purpose of the present invention to provide a new and improved method of fabricating LED arrays and driver packaging which provides for a molded carrier ring, that overall is simpler and more efficient than prior methods and which is easily adaptable to high production levels.

It is yet another purpose of the present invention to pride a new and improved electro-optical package and method of fabricating, which includes simpler construction and assembly than previous packages, involves lower cost in the manufacturing of the package, producing a stronger overall unit that includes easier mounting to a printed circuit board and involves easier overall handling.

SUMMARY OF THE INVENTION

The above problems and others are substantially solved and the above purposes and others are realized in an integrated electro-optical package including a molded carrier ring which serves to support a light emitting device (LED) display chip, a driver board, a plurality of driver chips, and a molded lens.

The display chip of the present invention is composed of an optically transparent substrate having a major surface with an array of light emitting devices formed on the major surface at a central portion thereof and cooperating to generate a complete image. Each of the light emitting devices have first and second electrodes for activating the light emitting devices. The optically transparent substrate further has a plurality of external connection/mounting pads adjacent outer edges thereof and outside of the central portion of the major surface with the first electrodes of the light emitting devices being connected to a first plurality of the external connection/mounting pads and the second electrodes of the being light emitting devices being connected to a second plurality of the external connection/mounting pads. The array of LEDs and the contained electrical connections form the LED display chip, or light emitting device imager (LEDI) chip of the present invention.

There is provided a driver board having an upper first major surface and a second opposed major surface, defining a central opening substantially coextensive with the complete image at the central portion of the major surface of the optically transparent substrate. The driver board further has a plurality of electrical conductors formed thereon as surface mounted leadframes, and/or patterned electrical interconnects. Each of the plurality of electrical conductors extends from a connection/mounting pad adjacent an edge of the central opening on the second opposed major surface of the driver board, to a connection/mounting pad formed about a periphery of the second opposed major surface of the driver board. An additional plurality of electrical conductors, formed as embedded leadframes or plated through-hole vias, extend from the plurality of connection/mounting pads formed about the periphery of the second opposed major surface of the driver board, to a plurality of connection/ mounting pads formed on the upper first major surface of the driver board.

The optically transparent substrate of the LED display chip can be, for example, formed of glass or some other suitable transparent material defining the central portion, and having the array of light emitting devices formed thereon. The plurality of external connection/mounting pads of the optically transparent substrate are positioned to align with the plurality of connection pads adjacent an edge of the central opening of the driver board. During assembly, the major surface of the optically transparent substrate is flip chip bump bonded to the second opposed major surface of the driver board, substantially coextensive with the central opening formed in the driver board, with the first and second pluralities of external connection/mounting pads of the optically transparent substrate being in electrical contact with the connection/mounting pads of the driver board. A plurality of driver and controller circuits are mounted on the upper first major surface of the driver board and have data input terminals and further have control signal output terminals connected to the first and second electrodes of the light emitting devices for activating the light emitting devices to generate complete images in accordance with data signals applied to the data input terminals.

In the preferred embodiment the first plurality of external connection/mounting pads and the second plurality of external connection/mounting pads of the optically transparent substrate are bump bonded to the plurality of mounting/connection pads formed adjacent an edge of the central opening of the driver board to substantially reduce the allowable pitch of the connection/mounting pads. Also, the connection pads on the major surface of the driver board are positioned into a matrix of rows and columns to allow a substantially greater number of connection pads in a substantially smaller surface area.

There is provided a molded carrier ring having embedded therein conductors, such as embedded leadframes, in electrical cooperation with the driver board and display chip, for external connection of the electro-optical package to a standard printed circuit board. The molded carrier ring serves to support the driver board in an embodiment where the driver board is the main stress member, supporting the LED display chip, the driver and control circuits, and a molded lens. Alternatively, the molded carrier ring is formed having a plurality of structural arms, or rib-like support members, extending from a periphery of the carrier ring to a central area, defining a central opening, with the plurality of structural arms serving to act as stress members by supporting the molded lens within the central opening formed by the structural arms. Alternatively, the molded lens may be monolithically formed with the carrier ring, in the central area defined by the structural arms. The embedded driver board, in this particular embodiment, continues to support the LED display chip and the plurality of driver and control circuits.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 4 is a simplified sectional view of the components of an electro-optical package of the present invention, wherein the driver board acts as a main stress member in conjunction with the molded carrier ring, assembled into a complete package;

FIG. 6 is a simplified sectional view of the components of an electro-optical package of the present invention assembled into a complete package, wherein the molded carrier ring has extending therefrom structural arms to support the molded lens;

DESCRIPTION OF THE PREFERRED EMBODIMENT

Figure 1:
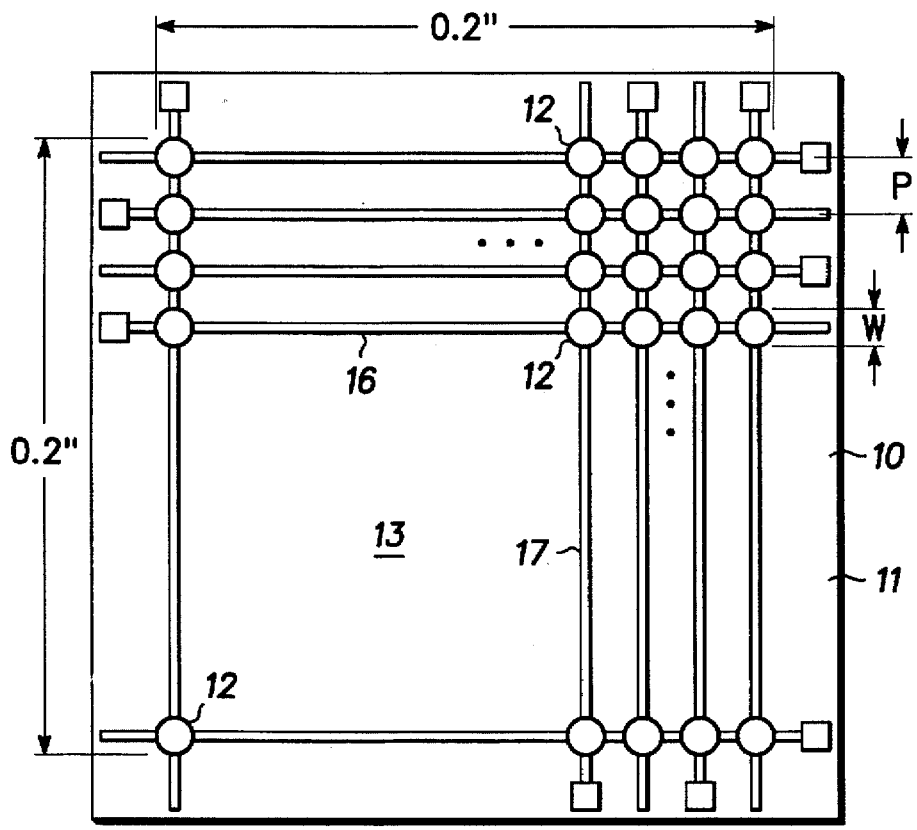
FIG. 1 is a greatly enlarged view in top plan of a partial array of light emitting devices formed on an optically transparent substrate.

During the course of this description, like numbers are used to identify like elements according to the different figures that illustrate the invention. It should be understood that a wide variety of light emitting devices, including liquid crystal displays (LCDs), light emitting diodes (LEDs), vertical cavity surface emitting lasers (VCSELs), etc., can be utilized, but light emitting diodes will be utilized throughout the following description for simplicity. Referring specifically to FIG. 1, a greatly enlarged view in top plan of an optically transparent substrate 10 having an array 15 of light emitting devices thereon is illustrated. For simplicity of illustration, only a representative portion of optically transparent substrate 10 has been completed. Optically transparent substrate 10 has a major surface 11 with a plurality of light emitting devices 12 formed thereon. Light emitting devices 12 are organic/polymer electroluminescent elements or light emitting diodes. Hereinafter, for simplification of this disclosure, the term organic/polymer will be shortened to "organic". In this embodiment, each light emitting device 12 defines a pixel, with light emitting devices 12 positioned in rows and columns and cooperating to generate a complete image, when activated, at a central portion 13 of major surface 11.

Figure 2:
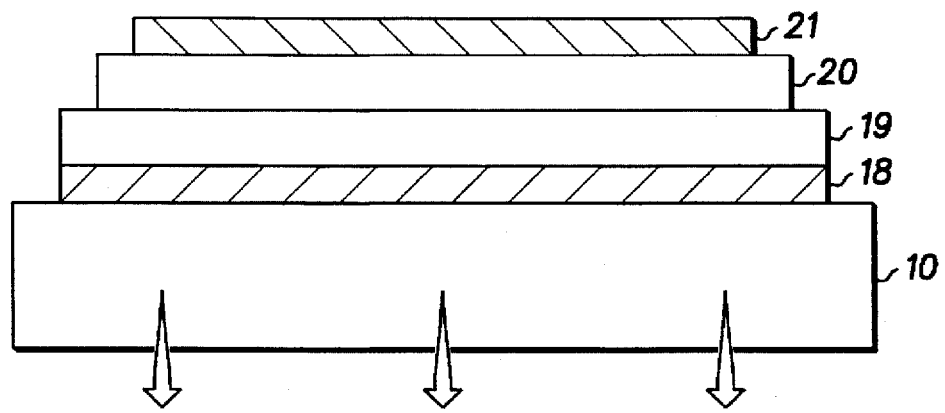
FIG. 2 is a simplified cross-sectional view of a single organic electroluminescent element on a glass substrate.

Referring specifically to FIG. 2, a simplified and greatly enlarged cross-sectional view of a single organic light emitting device 12 on optically transparent substrate 10, which in this embodiment is an optically transparent glass substrate, is illustrated. Light emitting device 12 includes a layer 18 of conductive material which serves as the anode of the device 12 in this specific embodiment. An organic layer or layers 19/20 includes one or more layers of polymers or low molecular weight organic compounds. The organic materials that form the layers are chosen for their combination of electrical and luminescent properties, and various combinations of hole transporting, electron transporting, and luminescent materials can be used. In this embodiment, for example, layer 19 is a hole transport layer and layer 20 is a luminescent electron transport layer. A second layer 21 of conductive material is deposited on the upper surface of layers 19/20 and serves as the cathode in this specific embodiment. For illustrative purposes, the directional arrows shown in FIG. 2, are meant to illustrate the direction of the light emitted by the light emitting devices 12.

Generally, either the anode or the cathode must be optically transparent to allow the emission of light therethrough. In this embodiment layer 18 is formed of indium-tin oxide (ITO) which is optically transparent. In some applications a very thin metal film may be used as a transparent conductor instead of the ITO. Also, to reduce the potential required, the cathode is generally formed of a low work function metal/ conductor or combination of metals/conductors, at least one of which has a low work function. In this embodiment the cathode is formed of low work function material, such as heavily doped diamond, or the cathode may be a conductive metal incorporating cesium, calcium or the like. A plurality of first electrodes, e.g. the anodes, of light emitting devices 12 are connected by horizontal electrical conductors 16 to define rows of pixels, and a plurality of second electrodes, e.g. the cathodes, of light emitting devices 12, are connected by vertical electrical conductors 17 to define columns of pixels, thereby forming a LED display chip 14, or LEDI chip, from an addressable array 15 of light emitting devices 12.

A list of some possible examples of materials for the organic layer or layers 19/20 of the above described light emitting device 12 follows. As a single layer of polymer, some examples are: poly(p-phenylenevinylene) (PPV); poly (p-phenylene) (PPP); and poly[2-methoxy, 5-(2'-ethylhexoxy)1,4-phenylenevinylene] (MEH-PPV). As an electron transporting electroluminescent layer between a hole transporting layer or one of the single layer polymers listed above and a low work function metal cathode, an example is: 8-hydroxquinoline aluminum (ALQ). As an electron transporting material, an example is: 2-(4-tert-butylphenyl)-5-(p-biphenylyl)-1,3,4-oxadiazole (butyl-PBD). As a hole transport material, some examples are: 4,4'-bis[N-phenyl-N-(3-methylphenyl)amino]biphenyl (TPD); and 1,1-bis(4-di-p-tolyaminophenyl)cyclohexane. As an example of a fluorescent. that may be used as a single layer or as a dopant to an organic charge transporting layer is coumarin 540, and a wide variety of fluorescent dyes. Examples of low work function metals include: Mg:In, Ca, and Mg:Ag.

Light emitting devices 12 are formed on optically transparent substrate 10 in a central portion 13 of major surface 11 less than approximately 20 microns in diameter, in the embodiment illustrated approximately 10 microns in diameter. Also, the pitch, or spacing between centers of light emitting devices 12, is less than approximately 30 microns, and in the present embodiment is 20 microns.

Figure 3:
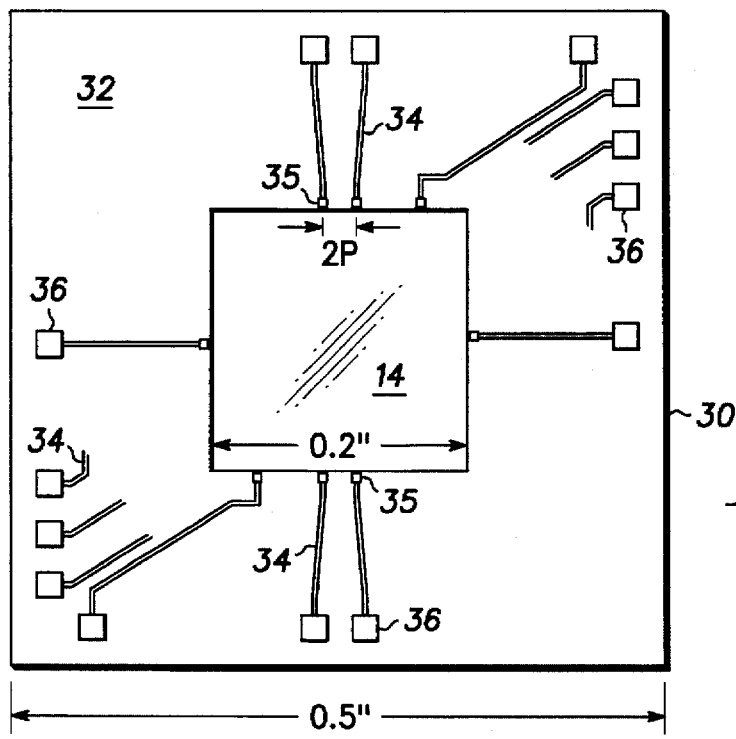
FIG. 3 is an enlarged view in top plan of a LEDI chip mounted on a driver board having defined therein a central opening, including a plurality of electrical connections.

In addition to optically transparent substrate 10, a mounting board, or driver board, is included having a plurality of driver and control circuits (not shown) mounted on a major surface thereof. Referring specifically to FIG. 3, an enlarged view in top plan of LED display chip 14, positioned on a driver board 30 is illustrated. In the simplest embodiment, driver board 30 is a separate component, formed of a convenient printed circuit board, such as FR4 or the like, having an upper first major surface (not shown) and a second opposed major surface 32. There are positioned on the upper first major surface of driver board 30 a plurality of glob top, or overmolded, driver and control circuitry chips (not shown) which are attached to driver board 30 using wirebonding technology and/or bump bonding technology. The plurality of driver and control circuitry chips are composed of driver and control circuits generally formed as smaller integrated circuits which are wire bonded or bump bonded to electrical contacts on the first major surface of driver board 30. Driver board 30 has formed within a central area, a central opening 33 through which the image generated by LED display chip 14 passes.

Illustrated in FIG. 3 is the second opposed major surface 32 of driver board 30 having LED display chip 14 mounted substantially coextensive with the central opening (not shown) formed through the first major surface and the second opposed major surface 32 of driver board 30. Disclosed in the preferred embodiment of driver board 30 are a plurality of electrical conductors 34, each extending from a connection/mounting pad 35 on the second opposed major surface 32 of driver board 30, adjacent an edge of the central opening (not shown), to a connection/mounting pad 36, positioned about the outer periphery of driver board 30, to electrically connect the rows and columns of light emitting devices 12 of LED display chip 14 to connection/mounting pads 36. To completely distribute electrical conductors 34 and connection/mounting pads 36 around the periphery of driver board 30, electrical conductors 34 are attached to alternate horizontal electrical conductors 16 and alternate vertical electrical conductors 17 of LED display chip 14, as illustrated in FIG. 1. Thus, the space available between adjacent electrical conductors 34 is 2P, or in this specific embodiment 20 microns.

By fanning out electrical conductors 34, connection/mounting pads 36 can be constructed large enough to provide easy electrical contact thereto. For example, if array 15 of light emitting devices 12 includes 40,000 devices (e.g., 200×200) and each device includes an area having a 10 micron diameter with a pitch P of 20 microns, then the area of a central opening of driver board 30 will be less than 0.2 inches on a side. Driver board 30, in this specific embodiment, is constructed with the central opening approximately 0.2 inches on a side and an outer periphery of 0.5 inches on a side. Thus, the 200 connection/mounting pads on each side of the periphery of driver board 30 have approximately 60 microns of pitch available.

Electrical conductors 34 and connection/mounting pads 35 and 36 can be formed from a plurality of partially embedded pattern electrical interconnects, surface or embedded copper leads, solder paste screen print interconnects, gold plated interconnects or metal evaporation. In addition, sol-gel technology, incorporating the usual steps of printing, patterning, and fusing can be utilized, as well as standard thin film metallization in which layers of metal are deposited by, for example, sputtering. In a typical metallization system, a first layer of chromium is applied by sputtering to operate as an adhesive layer on driver board 30. A second layer of copper is applied over the chromium to provide the desired electrical conduction and a layer of gold is applied over the copper to provide a barrier and adhesive layer for further connections. It should be understood that the metallization can be either an additive or subtractive method with the patterning and etching being performed by any of the various methods well known in the art to provide the desired final structure.

Figure 5:
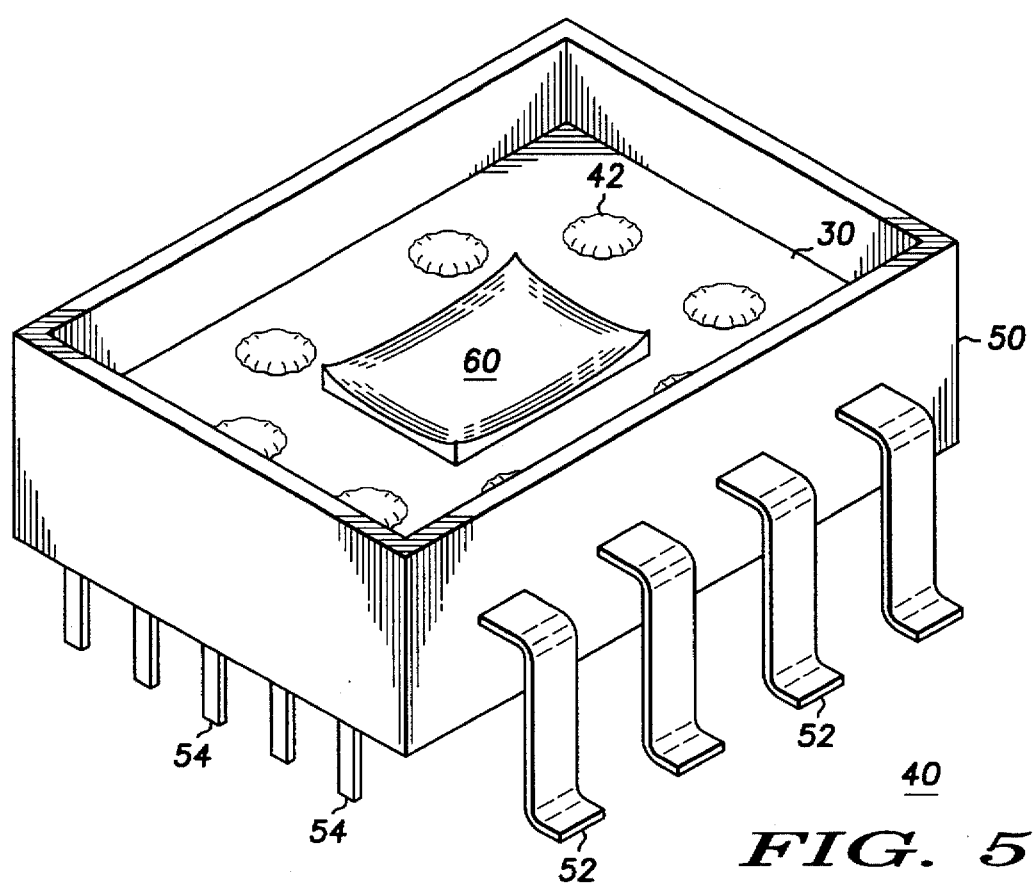
FIG. 5 is a top view in perspective illustrating the relative positions of the components of an electro-optical package, similar to that illustrated in FIG. 4, in accordance with the present invention.

Referring now to FIGS. 4-7, illustrated are two embodiments of an electro-optical package with a molded carrier ring, referenced here as 40 and 40'. It should be noted that all components of the first embodiment that are similar to components of the second embodiment, as well as similar to components illustrated in FIGS. 1 and 3, are designated with similar numbers, having a prime added to indicate the different embodiment. Referring specifically to FIG. 4, a greatly enlarged sectional view, illustrating the relative positions of the components of an electro-optical package 40 are illustrated. Referring specifically to FIG. 5, shown in perspective is the first embodiment of the completely integrated electro-optical package 40 of the present invention. In the assembly process, driver board 30 is positioned so that the first major surface 31 is up and connection/mounting pads 35 on second opposed major surface 32 are positioned to each contact a connection pad on LED display chip 14 when driver board 30 and LED display chip 14 are properly registered, as illustrated in FIG. 4. Driver board 30 is included as having a plurality of driver and control circuits 42 mounted on first major surface 31 thereof. Driver and control circuits 42 generally are formed as smaller integrated circuits which are wire bonded or bump bonded to electrical contacts on first major surface 31 of driver board 30. Driver board 30 is, for example, a convenient printed circuit board, such as an FR4 board or the like.

LED display chip 14 is bump bonded to driver board 30 using standard bump bonding technology. In addition, driver and control circuits 42 are mounted to the first major surface 31 of driver board 30 using either wire bonding technology or bump bonding technology. The bumps (if used) mounting the LED display chip 14 and the driver and control circuits 42 are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. For smaller pitches, 5 micron diameter copper bumps with a pitch of 10 microns have been formed with a bump height of 20 microns. Also, 15 micron diameter gold bumps on a 30 micron pitch have been formed to a height of 30 to 45 microns. Some compatible metal may improve the assembly procedures, e.g., gold metallization or gold plating on connection/mounting pads 36 of driver board 30.

In one fabrication technique, driver board 30 includes gold connection/mounting pads 35 and 36 and a plurality of connection pads positioned on a first major surface 31 for the mounting of the driver and control circuits 42. Connection mounting pads 36 and a plurality of connection pads positioned on a first major surface 31 of driver board 30 are interfaced using a plurality of plated through-hole vias 44, and/or embedded leadframes 45. Driver and control circuits 42 are mounted on the first major surface 31 of driver board 30, opposite the mounting of LED display chip 14 thereby providing sufficient area for the fan-out of electrical conductors 34 and connection/mounting pads 36 on the second opposed major surface of driver board 30. As stated, LED display chip 14 also includes gold connection/mounting pads and is flip chip thermo-compression bonded to driver board 30.

This invention simplifies the packaging and assembly of the electro-optical package by integrating LED display chip 14 with driver board 30, having driver electronics mounted thereon. Driver board 30 is embedded into a molded carrier ring (discussed presently) in electrical interface, thereby serving as the main stress member of the electro-optical package, or alternatively is embedded into a molded carrier ring having monolithically formed structural arms, which serve as stress members, in conjunction with driver board 30, of the electro-optical package. The resulting package can then be directly mounted to a printed circuit board so that electronic signals can be interfaced.

As illustrated in FIGS. 4–7, driver board 30 is embedded into a molded carrier ring 50 defining a peripheral ring structure and having external electrical interface through an embedded leadframe 51. Embedded leadframe 51 is be configured to interface with an external printed circuit board (not shown) by forming a plurality of leadframe legs 52, leadframe pins 54 or mounting bumps 56 (shown in FIG. 6). In the first embodiment of electro-optical package 40, driver board 30 is embedded into molded carrier ring 50. Driver board 30 serves as the main stress member for the package by supporting the LED display chip 14 and the driver and control circuits 42, (discussed previously), and by supporting a molded lens 60 (discussed presently). In that driver board 30 is manufactured to be very thin and compact, and acts as the sole supporting member for the various components of electro-optical package 40, electro-optical package 40 is simple and cost effective to both manufacture and assemble.

The final element in electro-optical package 40 is lens 60 which is formed using transfer molding techniques. Lens 60 is designed to serve as one element of an optical magnifier system that magnifies the image generated by array 15 of light emitting devices 12 of LED display chip 14. Lens 60, is preferably an injection molded refractive lens or an injection molded diffractive lens that is molded and capable of being snap-fit or epoxy glued into central opening 33 of driver board 30. In the alternative, it is disclosed to manufacture molded lens 60 separate and apart from the remainder of the components of electro-optical package 40, and thereafter mount it by any convenient means now known in the art, onto the package.

The interstice between LED display chip 14, driver board 30 and molded lens 60, mounted thereon is filled with an optically transparent material 62, which may be any convenient material to provide support and make electro-optical package 40 a more robust package. In addition, LED display chip 14 subsequent to the mounting on driver board 30, has a layer of overmolding 64, positioned on a side opposite the mounting of LED display chip 14, to protect LED display chip 14 and further reduce the damage of any stress exerted on LED display chip 14.

It should be understood that for best results driver board 30 and optically transparent material 62 should be constructed with indices of refraction which are as close together as practical. If, for example, the index of refraction of driver board 30 and optically transparent material 62 differs substantially there is a tendency for light to reflect back from optically transparent substrate 10 and the efficiency of electro-optical package 40 is reduced. Generally, an index of refraction of approximately 1.5 for driver board 30 and optically transparent material 62 has been found to be acceptable.

In addition, an optically transparent substrate of glass or the like, such as optically transparent substrate 10, has the added advantage of providing additional environmental protection for array 15 of light emitting devices 12. In that transparent material, such as glass and the like can be provided which has a coefficient of thermal expansion which is the same as, or very close to, the coefficient of thermal expansion of the driver board 30, substantial improvements in thermal cycling life are achieved with this package.

Figure 7:
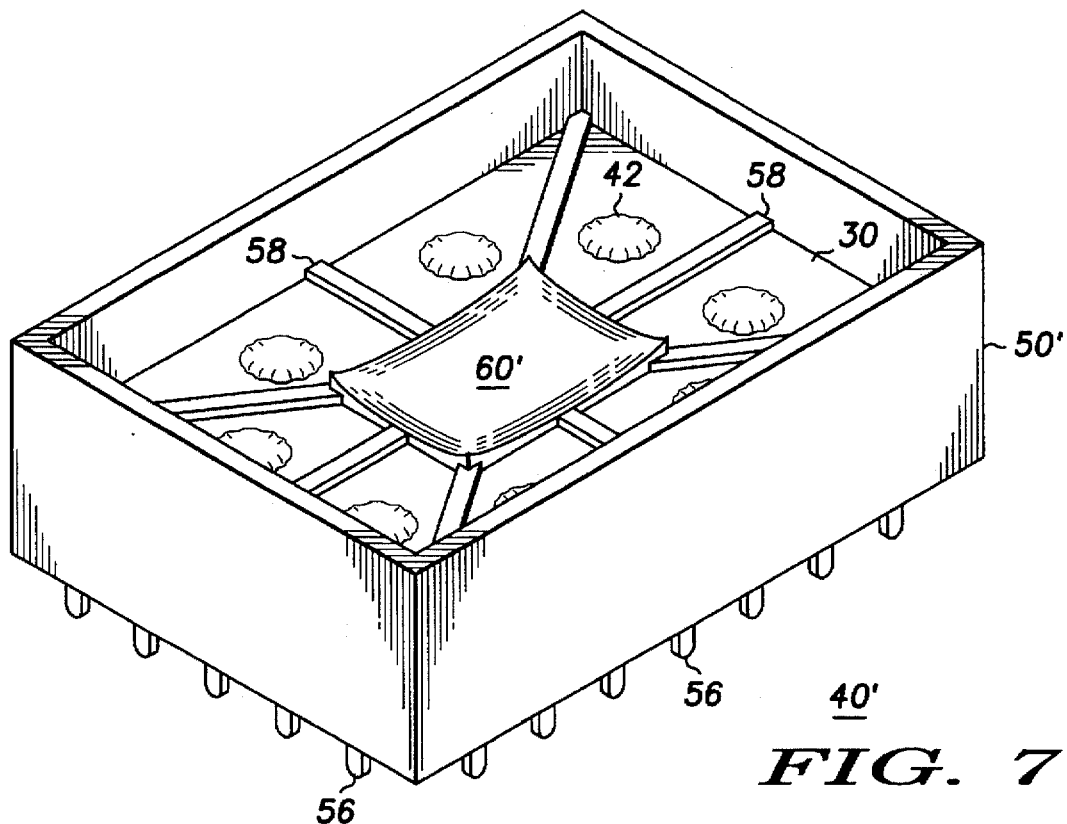
FIG. 7 is a top view in perspective illustrating the relative positions of the components of an electro-optical package, similar to that illustrated in FIG. 6, in accordance with the present invention.

Referring now to FIGS. 6 and 7, illustrated is a second embodiment of electro-optical package 40, referenced here as 40'. Again, it should be noted that all components of the first embodiment that are similar to components of the second embodiment, as well as similar to components illustrated in FIGS. 1 and 3, are designated with similar numbers, having a prime added to indicate the different embodiment. Electro-optical package 40', like electro-optical package 40, is composed of a LED display chip 14', bump bonded to a driver board 30', such as a FR4 board or the like, having defined therein a central opening 33', through which a complete image generated by the array 15' of light emitting devices 12' of LED display chip 14' passes. Driver board 30', having a first major surface 31' and a second opposed major surface 32', has formed therein a plurality of electrical interconnects, namely a plurality of plated through-hole vias 44' and/or a plurality of embedded leadframes 45', to electrically connect the plurality of connection pads 36', positioned about a periphery of driver board 30', to a plurality of driver and control circuits 42' mounted on a second opposed major surface 32' of driver board 30'. Molded carrier ring 50' in this embodiment of electro-optical package 40' is molded to form a plurality of structural arms 58 which serve in addition to driver board 30', as the main stress members of electro-optical package 40'. Structural arms 58 are monolithically molded as part of carrier ring 50' and project toward a central area, as shown in FIG. 7, thereby defining a central opening 59. As disclosed in the first embodiment, molded lens 60' is formed to snap-fit mount or epoxy glue mount into the central opening 59 defined by the plurality of structural arms 58, substantially coextensive with central opening 33' of driver board 30' and the complete image generated by the array 15' of light emitting devices 12'. In the alternative, molded lens 60' can be monolithically molded with molded carrier ring 50' and structural arms 58 at the time of formation.

Driver board 30' is interfaced with a external printed circuit board (not shown) using a plurality of embedded leadframes 51', that are configured to have a plurality of leadframe legs (not shown), a plurality of leadframe pins (not shown), as illustrated in FIGS. 4 and 5, or a plurality of mounting bumps 56, as illustrated in FIGS. 6 and 7. As in the formation of electro-optical package 40, electro-optical package 40' has a layer of optically transparent material 62' positioned within an area formed by the mounting of the various components, and a protective overmolding 64', positioned to overmold LED display chip 14', serving as a protective covering and to reduce any stress exerted on LED display chip 14'.

Figure 9:
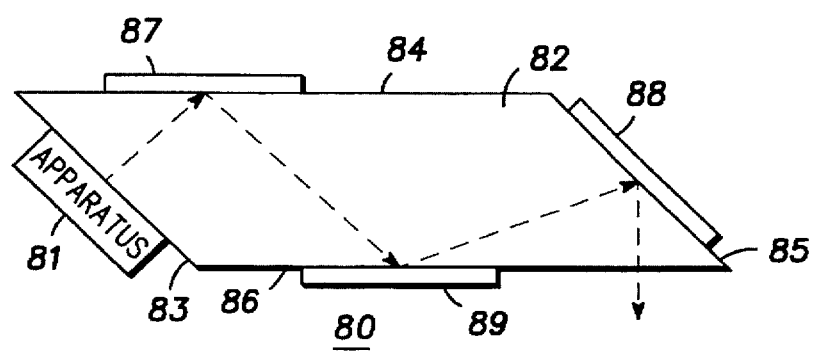
FIGS. 9 and 10 are additional simplified schematic views, similar to FIG. 8, of other miniature virtual image displays incorporating the electro-optical package of the present invention.
Figure 10:
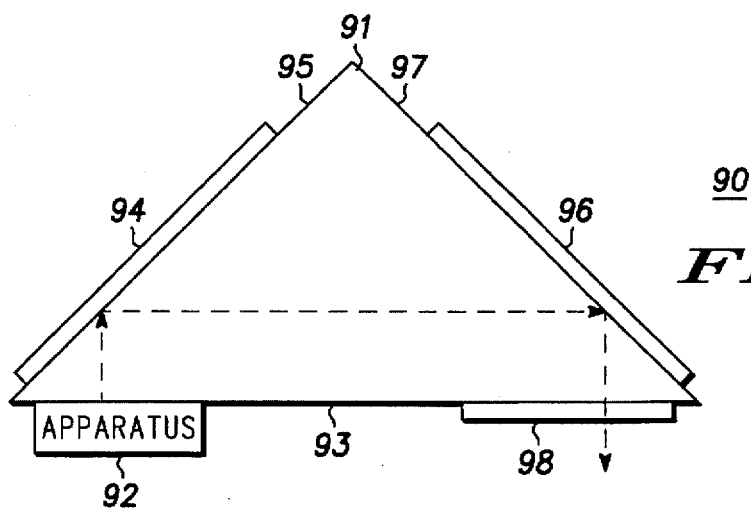

With regard to the disclosed embodiments, it should be understood that the image generated by the array of light emitting devices 12 on optically transparent substrate 10 is too small to properly perceive (fully understand) with the human eye and generally requires a magnification of at least 10× for comfortable and complete viewing. Lens 60 can be formed as a single lens with additional optical magnification supplied by an external system or lens 60 can be formed as a complete magnification system. Several examples of optical magnification systems which may be incorporated into lens 60 or applied externally thereto are illustrated in FIGS. 8 through 10, explained below.

Figure 8:
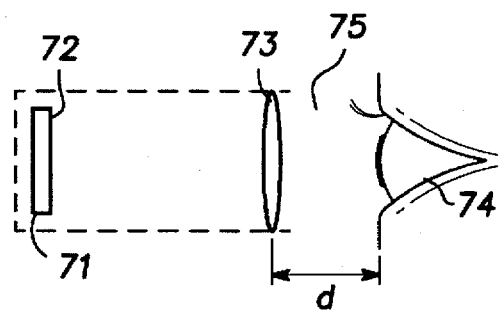
FIG. 8 is a simplified schematic view of a miniature virtual image display incorporating the electro-optical package of the present invention.

Referring to FIG. 8, a miniature virtual image display 70 is illustrated in a simplified schematic view. Miniature virtual image display 70 includes image generation apparatus 71, similar to electro-optical packages 40 and 40' described above, for providing an image on a surface 72. An optical system, represented by lens system 73, is positioned in spaced relation to surface 72 of miniature virtual image display 70 and produces an easily viewable virtual image viewable by an eye 74 spaced from an aperture 75 defined by lens system 73. As technology reduces the size of the electro-optical package and/or the light generating devices contained within, greater magnification and smaller lens systems are required.

Lens system 73, represented schematically by a single lens, is mounted in spaced relation from surface 72 so as to receive the image from surface 72 and magnify it an additional predetermined amount. It will of course be understood that lens system 73 may be adjustable for focus and additional magnification, if desired, or may be fixed in a housing for simplicity.

Eye relief is the distance that eye 74 can be positioned from viewing aperture 75 and still properly view the image, which distance is denoted by "d" in FIG. 8. Because of the size of lens system 73, eye relief, or the distance d, is sufficient to provide comfortable viewing and in the present embodiment is great enough to allow a viewer to wear normal eyeglasses, if desired. Because of the improved eye relief the operator can wear normal corrective lenses (personal eyeglasses), and the complexity of focusing and other adjustable features can be reduced, therefore, simplifying the construction of miniature virtual image display 70.

Referring to FIG. 9, another miniature virtual image display is illustrated in a simplified schematic. In waveguide virtual image display 80, image generation apparatus 81, similar to electro-optical packages 40 and 40' described above, is affixed to the inlet of an optical waveguide 82 for providing an image thereto. Optical waveguide 82 is formed generally in the shape of a parallelogram (side view) with opposite sides, 83, 84 and 85, 86, equal and parallel but not perpendicular to adjacent sides. Side 83 defines the inlet and directs light rays from the image at image generation apparatus 81 onto a predetermined area on adjacent side 85 generally along an optical path defined by all four sides. Three diffractive lenses 87, 88 and 89 are positioned along adjacent sides 85, 84 and 86, respectively, at three predetermined areas and the magnified virtual image is viewable at an outlet in side 86. This particular embodiment illustrates a display in which the overall size is reduced somewhat and the amount of material in the waveguide is reduced to reduce weight and material utilized.

Referring to FIG. 10, another specific miniature virtual image display is illustrated in a simplified schematic. In waveguide virtual image display 90 an optical waveguide 91 having a generally triangular shape in side elevation is utilized. Image generation apparatus 92, similar to electro-optical packages 40 and 40' described above, for producing an image, is affixed to a first side 93 of optical waveguide 91 and emanates light rays which travel along an optical path directly to a diffractive lens 94 affixed to a second side 95. Light rays are reflected from lens 94 to a diffractive lens 96 mounted on a third side 97. Diffractive lens 96 in turn reflects the light rays through a final refractive lens 98 affixed to the outlet of optical waveguide 91 in side 93, which refractive lens 98 defines a viewing aperture for waveguide virtual image display 90. In this particular embodiment the sides of waveguide virtual image display 90 are angularly positioned relative to each other so that light rays enter and leave the inlet and outlet, respectively, perpendicular thereto.

Figure 11:
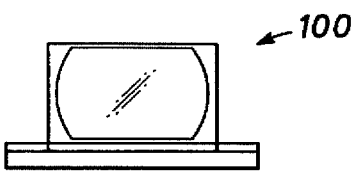
FIGS. 11, 12, and 13 illustrate a front view, side elevational view, and a top plan, respectively, of an image manifestation apparatus utilizing the integrated electro-optical package of the present invention.
Figure 12:
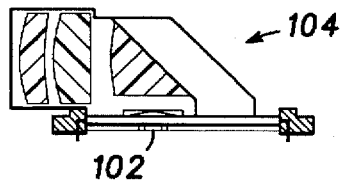
Figure 13:
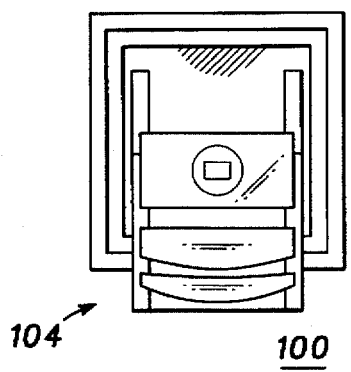

Referring now to FIGS. 11, 12 and 13, another miniature virtual image display 100 in accordance with the present invention, is illustrated in a front view, side elevational view, and top plan, respectively. FIGS. 11, 12 and 13 illustrate miniature virtual image display 100 approximately the actual size to provide an indication as to the extent of the reduction in size achieved by the present invention. Miniature virtual image display 100 includes an integrated electro-optical package 102, generally similar to packages, 40 and 40', which includes, in this specific embodiment, 144 pixels by 240 pixels. Each pixel is fabricated approximately 20 microns on a side with a center-to-center spacing between adjacent pixels of no more than 20 microns. In a preferred embodiment, integrated electro-optical package 102 produces a luminance less than approximately 15 fL. This very low luminance is possible because miniature virtual image display 100 produces a virtual image. Integrated electro-optical package 102 is mounted onto lens system 104, which magnifies the image approximately 15× to produce a virtual image approximately the size of an 8.5"×11" sheet of paper.

Here is should be noted that because integrated electro-optical package 102 is very small and the fact that a virtual image is utilized, rather than a direct view display, the overall physical dimensions of miniature virtual image display 100 are approximately 1.5 inches (3.8 cm) wide by 0.75 inches (1.8 cm) high by 1.75 inches (4.6 cm) deep, or a total volume of approximately 2 cubic inches (32 cm$^3$).

Figure 14:
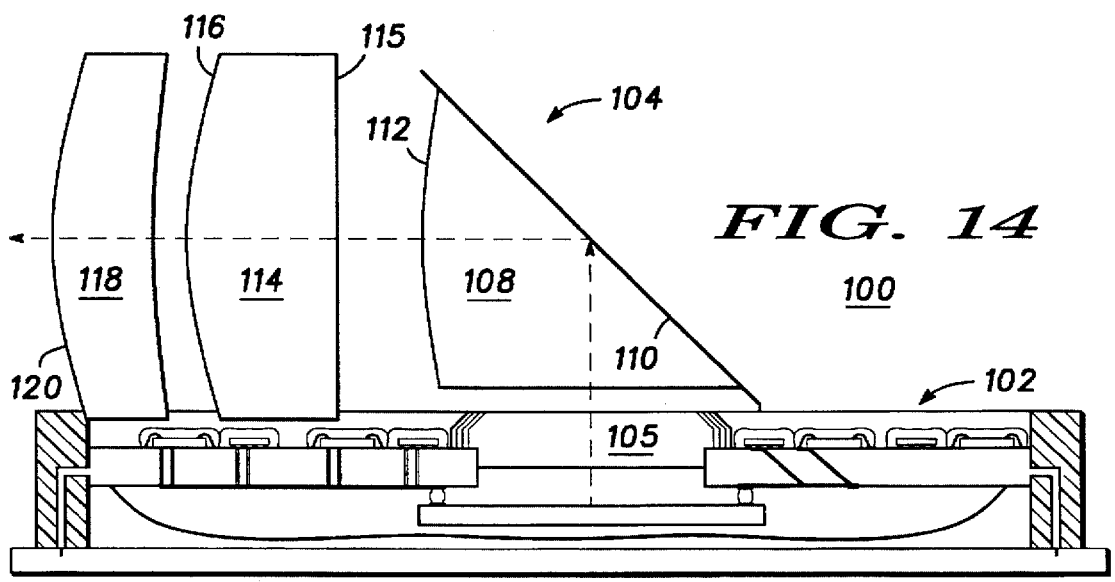
FIG. 14 is a 4× magnified view in side elevation of the apparatus of FIG. 11.

Referring specifically to FIG. 14, a 4× magnified view in side elevation of miniature virtual image display 100 of FIG. 11 is illustrated for clarity. From this view it can be seen that an air gap exists between the upper surface of a lens 105 (generally similar to lens 60 of the present invention) and an optical prism 108. Optical prism 108 is mounted to reflect the image from a surface 110 and from there through a refractive surface 112. The image is then directed to an optical lens 114 having a refractive inlet surface 115 and a refractive outlet surface 116. From optical lens 114 the image is directed to an optical lens 118 having an refractive inlet surface 119 and an refractive outlet surface 120. Also, in this embodiment at least one diffractive optical element is provided on one of the surfaces, e.g. surface 110 and/or refractive inlet surface 115, to correct for chromatic and other aberrations. The operator looks into refractive outlet surface 120 of optical lens 118 and sees a large, easily discernible virtual image which appears to be behind miniature virtual image display 100.

Figure 15:
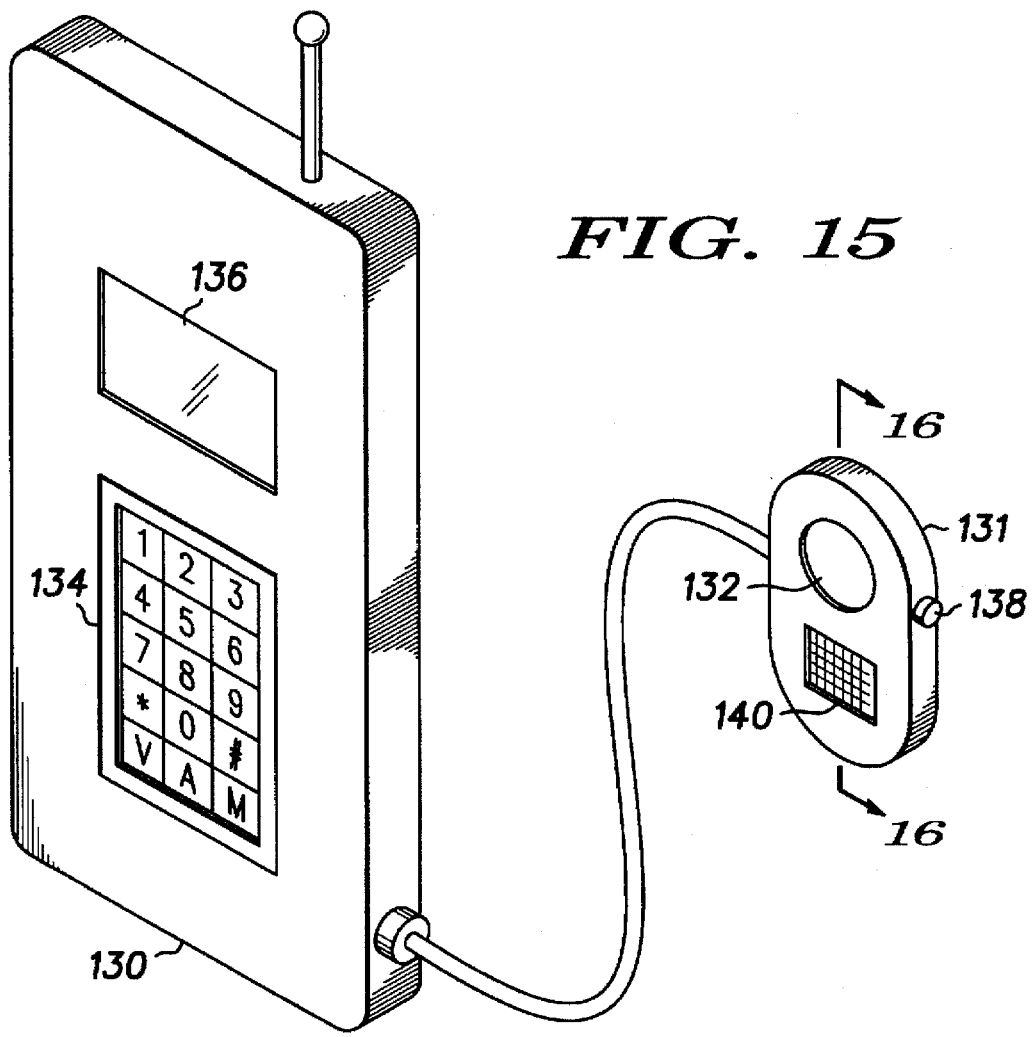
FIG. 15 is a view in perspective of a portable communications receiver incorporating the miniature virtual image display of FIG. 8.

FIG. 15, illustrates an example of a portable electronic device, namely a portable communications receiver 130, having a hand held microphone 131 with a miniature virtual image display 132 mounted therein. It will of course be understood that portable communications receiver 130 can be any of the well known portable receivers, such as a cellular or cordless telephone, a two-way radio, a pager, a data bank, etc. In the present embodiment, for purposes of explanation only, portable communications receiver 130 is a portable two-way police radio, generally the type carried by police officers on duty or security guards. Portable communications receiver 130 includes a control panel 134 for initiating calls and a standard visual display 136, if desired, for indicating the number called or the number calling. Hand held microphone 131 has a push-to-talk switch 138 and a voice pick-up 140.

Figure 16:
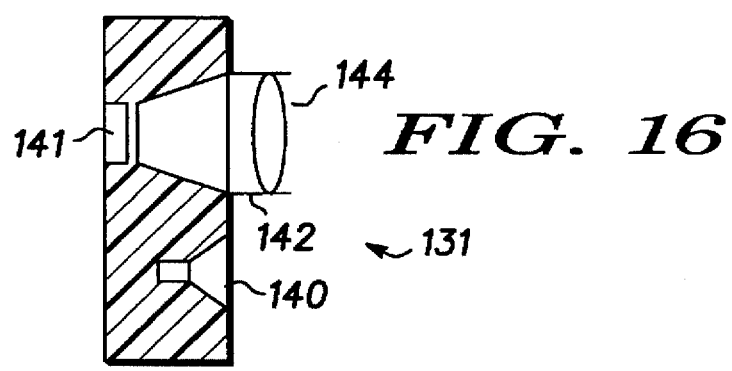
FIG. 16 is a simplified view generally as seen from the line 16—16 of FIG. 15.

Referring to FIG. 16, a simplified sectional view of hand held microphone 131, as seen from the line 16—16 of FIG. 15, is illustrated. Miniature virtual image display 132 includes an electro-optical package, similar to electro-optical packages 40 and 40', described above, having image generation apparatus 141 for providing an image to a fixed optical system 142, which in turn produces a virtual image viewable by the operator through an aperture 144. Fixed optical system 142 is constructed to magnify the entire image from image generation apparatus 141, without utilizing moving parts, so that the virtual image viewable through aperture 144 is a complete frame, or picture, which appears to be very large (generally the size of a printed page) and is easily discernible by the operator. The entire electro-optical package is relatively small and adds virtually no additional space requirements to hand held microphone 131. Optical system 142 is constructed with no moving parts, other than optional features such as focusing, zoom lenses, etc. Further, image generation apparatus 141 requires very little electrical power to generate the image and, therefore, adds very little to the power requirements of portable communications receiver 130.

Figure 17:
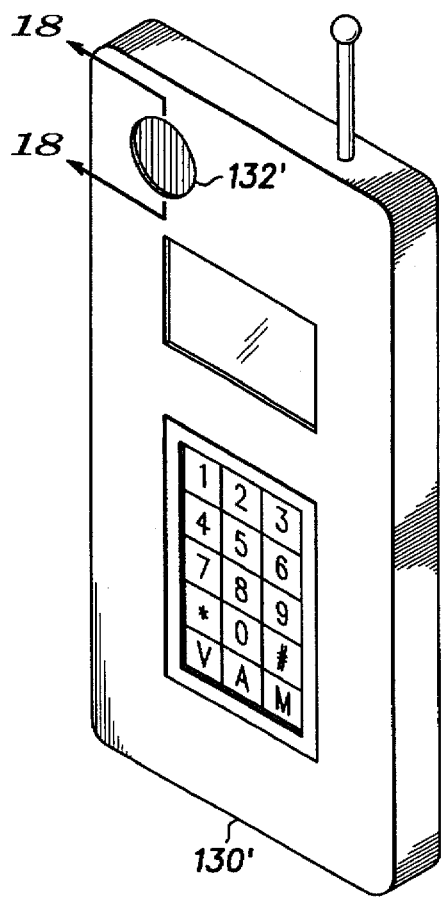
FIG. 17 is a view in perspective of another portable communications receiver incorporating the miniature virtual image display of FIG. 8.
Figure 18:
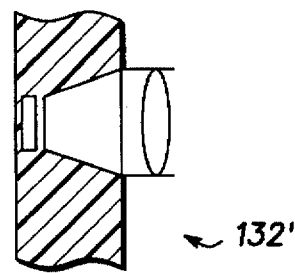
FIG. 18 is a simplified view generally as seen from the line 18—18 of FIG. 17.

Referring specifically to FIGS. 17 and 18, a second embodiment of a specific type of portable communications equipment is illustrated wherein parts similar to those described in relation to FIGS. 15 and 16 are designated with similar numbers with a prime added to the numbers to indicate a different embodiment. In this embodiment, a portable communications receiver 130' has a miniature virtual image display 132' included in the body thereof, instead of in a hand held microphone. A hand held microphone is optional and this specific embodiment is desirable for instances where a hand held microphone is not utilized or not available or for use in pagers and the like which do not transmit. Miniature virtual image display 132' is basically similar to miniature virtual image display 132 of FIGS. 15 and 16 and adds very little to the size, weight, or power consumption of portable communications receiver 130'.

Figure 19:
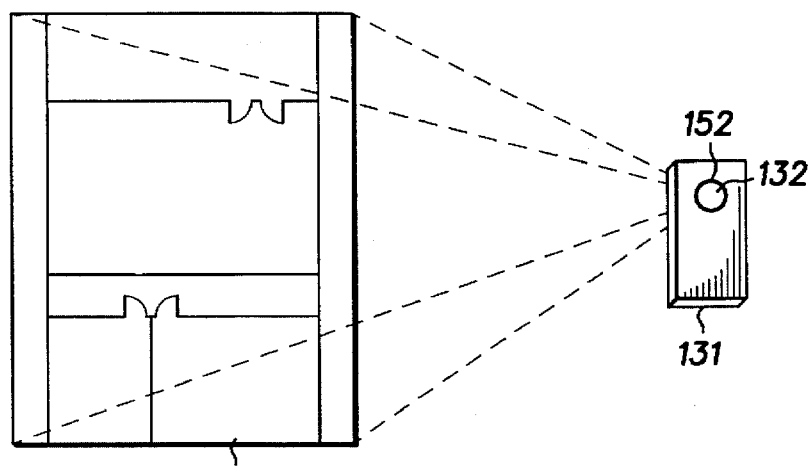
FIG. 19 is a view in perspective illustrating a typical view as seen by the operator of the portable communications receiver of FIG. 15.

FIG. 19 is a perspective view of hand held microphone 131 of FIGS. 15 and 16, illustrating a typical view 150 seen by an operator looking into viewing aperture 152 of miniature virtual image display 132, described in conjunction with FIGS. 15–18. View 150 could be, for example, a floor plan of a building about to be entered by the operator (a policeman). In operation, the floor plan is on file at the police station and, when assistance is requested by the policeman, the station simply transmits video representative of the previously recorded plan. Similarly, miniature virtual image display 132 might be utilized to transmit pictures of missing persons or wanted criminals, maps, extremely long messages, etc. Many other variations, such as silent receiver operation wherein the message appears on miniature virtual image display 132 instead of audibly, are possible.

It should be noted that in the prior art, pagers and other small receivers in which visual displays are desired, are especially handicapped by the size of the displays. Generally such displays are limited to a single short line of text or several digits, and the size of the display still dictates the size of the receiver. Further, the display is clearer and easier to read and, because it utilizes a virtual display, requires very little power for the operation thereof. In fact, the present display utilizing the electro-optical package of the present invention uses much less power than any of the direct view displays normally utilized in electronic equipment and, as a result, can be fabricated in much smaller sizes.

Thus, the present invention illustrates and teaches integrated electro-optical packages having a display chip, a driver board, a molded carrier ring and at least one molded optical component, that are not limited in size by the electrical connections and the optics and which are substantially smaller than previous integrated packages which perform the same functions. Also, the present invention illustrates and teaches an integrated electro-optical package which contains an array of light generating devices formed on a substrate, mounted on a driver board, which is electrically interfaced with a molded carrier ring. The driver board having a central opening defined therein, in combination with optical elements mounted either directly thereon, monolithically formed with the molded carrier ring, or positioned within a central portion of a plurality of structural arms of the molded carrier ring so as to create a generally compact and cost effective electro-optical package to manufacture.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated electro-optical package comprising:
    an optically transparent substrate with an array of light emitting devices formed thereon and cooperating to generate a complete image, the array of light emitting devices being positioned in rows and columns to define all pixels of the complete image and operably connected to a plurality of connection pads adjacent outer edges of the optically transparent substrate;
    a driver board, having defined therein a central opening, substantially coextensive with the complete image generated by the array of light emitting devices, a first plurality of connection pads formed on a surface surrounding the central opening, and a second plurality of connection pads formed on a surface about a periphery of the driver board, the first plurality of connection pads and the second plurality of connection pads having a plurality of electrical conductors extending therebetween, the plurality of connection pads of the array of light emitting devices being bump bonded to the first plurality of connection pads of the driver board; and a molded carrier ring, having embedded therein, a plurality of leadframes, electrically interfaced with and supporting the driver board, and further having a plurality of external electrical connections.

2. An integrated electro-optical package as claimed in claim 1 wherein the optically transparent substrate is formed of optically transparent glass.

3. An integrated electro-optical package as claimed in claim 1 wherein the driver board is a printed circuit board.

4. An integrated electro-optical package as claimed in claim 1 wherein the plurality of electrical conductors extending between the first plurality of connection pads and the second plurality of connection pads formed on the driver board are at least one of a plurality of surface mounted leadframes and a plurality of patterned electrical interconnects.

5. An integrated electro-optical package as claimed in claim 1 including a plurality of driver circuits positioned on the driver board and connected to the array of light emitting devices through the plurality of connection pads of the driver board and the plurality of connection pads of the optically transparent substrate.

6. An integrated electro-optical package as claimed in claim 5 wherein the driver board has provided therein, a plurality of electrical conductors, electrically connecting the first plurality of connection pads formed on the driver board with the plurality of driver circuits.

7. An integrated electro-optical package as claimed in claim 6 wherein the plurality of electrical conductors electrically connect the first plurality of connection pads and the second plurality of connection pads formed on the driver board and the plurality of driver circuits include one of a plurality of embedded leadframes and a plurality of plated through-hole vias.

8. An integrated electro-optical package as claimed in claim 1 wherein the driver board has positioned thereon a major surface, a molded lens, coextensive with the complete image generated by the array of light emitting devices to receive and magnify the complete image and produce an easily viewable virtual image.

9. An integrated electro-optical package as claimed in claim 1 wherein the molded carrier ring has monolithically formed a plurality of structural arms projecting from a peripheral ring structure, toward a central area of the molded carrier ring.

10. An integrated electro-optical package as claimed in claim 9 wherein the plurality of structural arms define within the central area, an opening into which a molded lens is positioned, coextensive with the complete image generated by the array of light emitting devices to receive and magnify the complete image and produce an easily viewable virtual image.

11. An integrated electro-optical package as claimed in claim 9 wherein the molded carrier ring further has monolithically formed within the central area, a molded lens, coextensive with the complete image generated by the array of light emitting devices to receive and magnify the complete image and produce an easily viewable virtual image.

12. An integrated electro-optical package as claimed in claim 1 wherein the array of light emitting devices includes a plurality of organic electroluminescent elements.

13. An integrated electro-optical package as claimed in claim 12 wherein the plurality of organic electroluminescent elements each include a first conductive layer positioned on a major surface of the optically transparent substrate, at least one layer of organic material positioned on the first conductive layer, and a second conductive layer positioned on the at least one layer of organic material.

14. An integrated electro-optical package as claimed in claim 13 wherein the first conductive layer on the major surface of the optically transparent substrate includes a layer of indium-tin oxide.

15. An integrated electro-optical package as claimed in claim 13 wherein the at least one layer of organic material on the first conductive layer includes one of a layer of polymer and a layer of low molecular weight organic compound.

16. An integrated electro-optical package comprising:

a light emitting device display chip comprised of an optically transparent substrate having a major surface with an array of light emitting devices formed on the major surface at a central portion thereof and cooperating to generate a complete image, each of the light emitting devices having a first electrode and a second electrode for activating the light emitting devices and having a plurality of electrical conductors formed on the major surface of the optically transparent substrate, the light emitting device display chip further having a plurality of external connection pads adjacent outer edges thereof and outside of the central portion of the major surface with the first electrode of each of the light emitting devices being connected to a first plurality of the external connection pads and the second electrode of each of the light emitting devices being connected to a second plurality of the external connection pads;

a driver board having a first major surface and a second opposed major surface and defining a central opening through the first and second opposed major surfaces, the driver board further having a first plurality of electrical conductors formed therein, extending from a plurality of connection pads adjacent an edge of the central opening on the second opposed major surface to a plurality of connection pads located about a periphery of the second opposed major surface of the driver board, and a second plurality of electrical conductors formed therein, extending from the plurality of connection pads located about the periphery of the second opposed major surface of the driver board, to a plurality of connection pads formed on the first major surface of the driver board, the major surface of the optically transparent substrate being mounted on the second opposed major surface of the driver board with the first plurality of the external connection pads and the second plurality of external connection pads of the optically transparent substrate being in electrical contact with the plurality of connection pads adjacent an edge of the central opening on the second opposed major surface of the driver board;

a plurality of driver and controller circuits mounted on the first major surface of the driver board and having a plurality of data input terminals and further having a plurality of control signal output terminals connected to the first and second electrodes of the light emitting devices through the first plurality of electrical conductors, the second plurality of electrical conductors and the plurality of connection pads of the driver board, and the plurality of connection pads of the optically transparent substrate, for activating the light emitting devices to generate images in accordance with a plurality of data signals applied to the plurality of data input terminals; and a molded carrier ring, electrically interfaced with and supporting the driver board, the light emitting device display chip and the plurality of driver and controller circuits, having a plurality of external connections formed therein.

17. An integrated electro-optical package as claimed in claim 16 wherein the optically transparent substrate is formed of optically transparent glass.

18. An integrated electro-optical package as claimed in claim 16 wherein the first plurality of electrical conductors and the second plurality of electrical conductors of the driver board include at least one of a plurality of partially embedded pattern electrical interconnects, a plurality of embedded leadframes, a plurality of surface mounted leadframes and a plurality of plated through-hole vias.

19. An integrated electro-optical package as claimed in claim 16 wherein the plurality of driver circuits on the first major surface of the driver board and the light emitting device display chip are electrically interfaced with one of wire bonding or bump bonding.

20. An integrated electro-optical package as claimed in claim 16 wherein the array of light emitting devices includes a plurality of organic electroluminescent elements.

21. An integrated electro-optical package as claimed in claim 16 wherein the plurality of electrical conductors formed on the major surface of the optically transparent substrate are positioned to fan out from the array of light emitting devices to the plurality of connection pads formed on the major surface of the optically transparent substrate, the first plurality of the external connection pads and the second plurality of the external connection pads on the major surface of the optically transparent substrate being positioned in rows and columns on the major surface thereof.

22. An integrated electro-optical package as claimed in claim 16 further including a molded lens, positioned coextensive with the complete image generated by the array of light emitting devices to receive and magnify the complete image and produce an easily viewable virtual image.

23. An integrated electro-optical package as claimed in claim 22 wherein the molded lens is fixedly attached to the central opening of the driver board.

24. An integrated electro-optical package as claimed in claim 22 wherein the molded lens is fixedly attached to the molded carrier ring.

25. An integrated electro-optical package as claimed in claim 22 wherein the molded lens is monolithically formed with the molded carrier ring.

26. An integrated electro-optical package comprising:

an optically transparent substrate having a major surface with a plurality of light emitting devices formed on the major surface, each of the light emitting devices having a first electrode and a second electrode for activating the light emitting devices, the light emitting devices defining a plurality of pixels positioned in rows and columns and cooperating to generate a complete image, when activated, at a central portion of the major surface, the optically transparent substrate further having a plurality of external connection pads adjacent outer edges thereof and outside of the central portion of the major surface with the first electrode of each of the light emitting devices being connected to a first plurality of the external connection pads defining rows of pixels and the second electrode of each of the light emitting devices being connected to a second plurality of the external connection pads defining columns of pixels;

a driver board having defined therein a central opening and having a first major surface and a second opposed major surface, a first and a second plurality of electrical connections formed on the second opposed major surface and a plurality of electrical interconnects formed between the first and the second plurality of electrical connections, a plurality of electrical connections formed on the first major surface of the driver board and a plurality of electrical interconnects formed in the driver board between the second plurality of electrical connections formed on the second opposed major surface and the plurality of electrical connections formed on the first major surface, the optically transparent substrate being mounted on the second opposed major surface of the driver board with the first plurality of electrical connections of the driver board in electrical contact with the first plurality of the external connection pads and the second plurality of external connection pads on the optically transparent substrate;

a plurality of driver and controller circuits mounted on the first major surface of the driver board, having a plurality of data input terminals and further having a plurality of control signal output terminals adapted to be connected to the first and second electrodes of the light emitting devices for activating the light emitting devices to generate the complete image in accordance with a plurality of data signals applied to the plurality of data input terminals;

a lens, positioned substantially coextensive with the complete image generated by the plurality of light emitting devices to receive and magnify the complete image and produce an easily viewable virtual image; and a molded carrier ring, electrically interfaced with and supporting the driver board, the plurality of light emitting devices and the plurality of driver and controller circuits, having a plurality of external electrical connections formed therein.

27. An integrated electro-optical package as claimed in claim 26 wherein the lens positioned substantially coextensive with the complete image generated by the plurality of light emitting devices to receive and magnify the complete image and produce an easily viewable virtual image is one of a diffractive lens and a refractive lens.

28. An integrated electro-optical package as claimed in claim 26 wherein the molded carrier ring further includes a plurality of monolithically formed structural arms, extending from an outer periphery of the molded carrier ring to a central area.

29. An integrated electro-optical package as claimed in claim 28 wherein the structural arms define a central opening in the central area, having positioned therein the lens.

30. An integrated electro-optical package as claimed in claim 28 wherein the structural arms have monolithically formed at the central area, the lens.

31. A portable electronic device with visual display comprising:

a portable electronic device having a data output terminal; and a miniature virtual image display having a viewing aperture, the miniature virtual image display being operably attached to a receiver and including an optically transparent substrate having a major surface with a plurality of light emitting devices formed on the major surface, each of the light emitting devices having a first electrode and a second electrode for activating the light emitting devices, the light emitting devices defining a plurality of pixels positioned in rows and columns and cooperating to generate a complete image, when activated, at a central portion of the major surface, the optically transparent substrate further having connection pads adjacent outer edges thereof and outside of the central portion of the major surface with the first electrodes of the light emitting devices being connected to a first plurality of the external connection pads defining rows of pixels and the second electrodes of the light emitting devices being connected to a second plurality of the external connection pads defining columns of pixels;

a driver board having a central opening defined therein and having a first major surface and a second opposed major surface with a first plurality of connection pads and a second plurality of connection pads formed on the second opposed major surface, a plurality of electrical interconnects formed between the first and second pluralities of connection pads, a plurality of connection pads formed on the first major surface of the driver board, and a plurality of electrical interconnects formed between the second plurality of connection pads formed on the second opposed major surface of the driver board and the plurality of connection pads formed on the first major surface of the driver board, the optically transparent substrate being mounted on the second opposed major surface of the driver board with the first plurality of connection pads of the driver board in electrical contact with the first and second pluralities of external connection pads of the optically transparent substrate;

a plurality of driver and controller circuits having a plurality of data input terminals connected to a data output terminal of the electronic device and further having a plurality of control signal output terminals adapted to be connected to the first and second electrodes of the light emitting devices for activating the light emitting devices to generate images in accordance with data signals applied to the plurality of data input terminals, the plurality of driver and controller circuits being mounted on the first major surface of the driver board with the plurality of control signal output terminals electrically contacting the plurality of connection pads on the first major surface of the driver board; and a molded carrier ring, having embedded therein a plurality of leadframes, electrically interfaced with the driver board, the plurality of light emitting devices and the driver and controller circuits.

32. A portable electronic device with visual display as claimed in claim 31 wherein the plurality of light emitting devices on the major surface of the optically transparent substrate include a plurality of organic electroluminescent elements on an optically transparent glass substrate.

33. A portable electronic device with visual display as claimed in claim 31 further comprised of one of a molded diffractive lens and a molded refractive lens mounted to the driver board, coextensive with the complete image generated by the plurality of light emitting devices, to receive and magnify the complete image and produce an easily viewable virtual image.

34. A portable electronic device with visual display as claimed in claim 31 further comprised of at least one of a molded diffractive lens and a molded refractive lens monolithically formed with the mounted carrier ring, coextensive with the complete image generated by the plurality of light emitting devices, to receive and magnify the complete image and produce an easily viewable virtual image.

35. A portable electronic device with visual display as claimed in claim 31 further comprised of at least one of a molded diffractive lens and a molded refractive lens mounted to the molded carrier ring, coextensive with the complete image generated by the plurality of light emitting devices, to receive and magnify the complete image and produce an easily viewable virtual image.

36. A portable electronic device with visual display as claimed in claim 31 wherein the portable electronic device includes portable communications equipment.

37. A portable electronic device with visual display as claimed in claim 36 wherein the portable communications equipment is one of a cellular telephone, a two-way radio, a data bank and a pager.

38. A method of fabricating an electro-optical package comprising the steps of:

forming a plurality of light emitting devices on a major surface of an optically transparent substrate, each of the plurality of light emitting devices having first and second electrodes for activating the light emitting devices, the light emitting devices defining a plurality of pixels positioned in rows and columns and cooperating to generate a complete image, when activated, at a central portion of the major surface, the optically transparent substrate further being formed with connection pads adjacent outer edges thereof and outside of the central portion of the major surface with the a plurality of first electrodes of the light emitting devices being connected to a first plurality of the external connection pads defining rows of pixels and a plurality of second electrodes of the light emitting devices being connected to a second plurality of the external connection pads defining columns of pixels;

forming a driver board having a central opening defined therein, with a first major surface and a second opposed major surface and forming first and second means for electrical connection on the second opposed major surface with a plurality of electrical interconnects formed between the first and second means for electrical connection, and forming a means for electrical connection on the first major surface of the driver board with a plurality of electrical interconnects formed between the means for electrical connection on the first major surface and the first and second means for electrical connection on the second opposed major surface;

forming a plurality of driver and controller circuits having a plurality of data input terminals and further having a plurality of control signal output terminals adapted to be connected to the first and second electrodes of the light emitting devices for activating the light emitting devices to generate the complete images in accordance with a plurality of data signals applied to the plurality of data input terminals;

mounting the optically transparent substrate on the second opposed major surface of the driver board with the first means for electrical connection of the driver board in electrical contact with the first and second pluralities of external connection pads of the optically transparent substrate;

mounting the plurality of driver and controller circuits on the first major surface of the driver board with the plurality of control signal output terminals electrically contacting the plurality of connection pads on the first major surface of the driver board; and molding a carrier ring about an outer periphery of the driver board, having a plurality of embedded leadframes supported therein, electrically interfaced with the driver board, the light emitting devices and the plurality of driver and controller circuits.

39. A method of fabricating an electro-optical package as claimed in claim 38 wherein the step of forming a plurality of light emitting devices on the major surface of an optically transparent substrate includes forming a plurality of organic electroluminescent elements on an optically transparent glass substrate.

40. A method of fabricating an electro-optical package as claimed in claim 38 further includes the step of mounting one of a molded diffractive lens and a molded refractive lens on one of the driver board and the carrier ring, coextensive with the complete image generated by the plurality of light emitting devices to receive and magnify the complete image and produce an easily viewable virtual image.

41. A method of fabricating an electro-optical package as claimed in claim 38 further includes the step of monolithically molding one of a diffractive lens and a refractive lens with the carrier ring, coextensive with the complete image generated by the plurality of light emitting devices to receive and magnify the complete image and produce an easily viewable virtual image.

* * * * *